United States Patent Office 3,443,245
Patented May 6, 1969

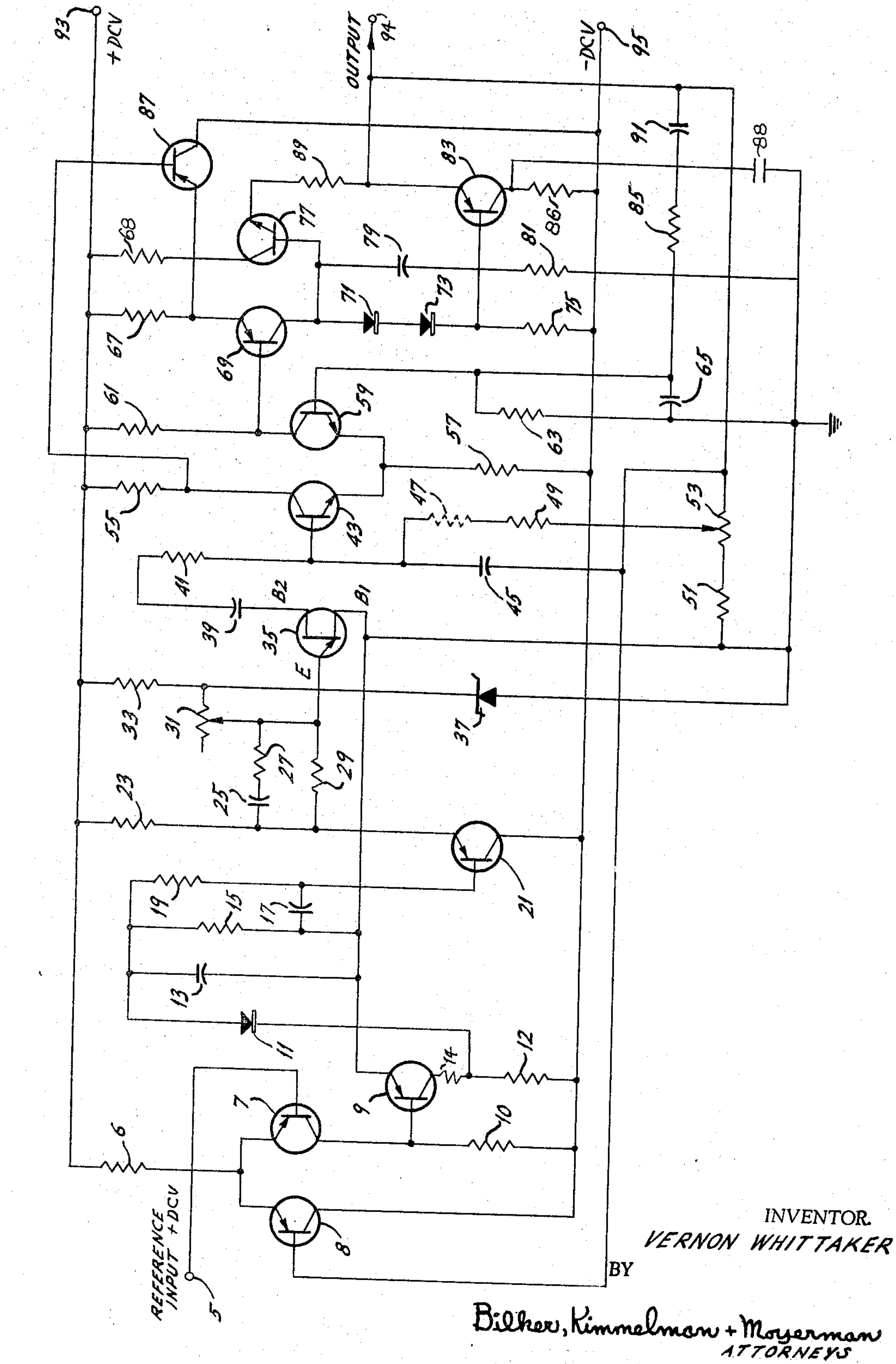
INVENTOR.
VERNON WHITTAKER
BY
Bilker, Kimmelman + Moyerman
ATTORNEYS

3,443,245
STABILIZED OSCILLATOR
Vernon Whittaker, Ambler, Pa., assignor to Automatic Timing and Controls, Inc., King of Prussia, Pa., a corporation of Pennsylvania
Filed Jan. 7, 1966, Ser. No. 519,329
Int. Cl. H03b 3/02
U.S. Cl. 331—109 5 Claims

ABSTRACT OF THE DISCLOSURE

This oscillator has its output voltage inverted by a Wien bridge and applied back to its input. In addition, part of the output is fed back to the input of the amplifier as negative feedback. The oscillator output wave is also fed back to a differential amplifier and rectifier where it is compared with a DC control signal to derive a DC error signal whose amplitude is a function of the amplitude of the output wave. The amount of negative feedback is governed by the DC error signal in conjunction with a variable impedance (unijunction) transistor whose impedance is controlled by the error signal. Thus the amplitude of the oscillator is maintained substantially constant.

This invention relates to an oscillatory circuit and in particular to a highly stable precision oscillator.

There are many applications in which an oscillator is desired which has great stability of amplitude especially with regard to changes in temperature. Such oscillators are extremely useful in instrumentation systems such as those employing a transducer element, e.g., a differential transformer. Oscillators which do not require transformer coupling yet produce a high power output are also in demand. In addition, for any instrumentation or other precision application it is highly desirable that the oscillator possess very good frequency stability especially without the necessity for using a relatively high-priced crystal control element. Precision in the variability of amplitude is a further desirable feature of such an oscillator.

It is therefore among the objects of the present invention to provide an oscillatory circuit having:

(1) high amplitude stability,
(2) high power output without using a transformer,
(3) very good frequency stability without requiring a crystal, and
(4) precise variability of amplitude.

Still other objects of the present invention wi:l be appreciated from an inspection of the drawing and perusal of the specification and claims herein.

The single figure depicts one embodiment of the present invention.

In accordance with my invention, I provide an oscillator whose output wave is compared with a reference voltage ultimately to derive a DC error signal. This DC signal is used, in conjunction with a variable impedance device, such as a unijunction transistor, to control the amplitude of a negative feedback signal which is applied to the oscillator input thereby maintaining the latter's output wave substantially constant in amplitude.

Referring to the sole figure, one embodiment of the present invention is seen in which there are a number of subcircuits. First, there is a differential amplifier and rectifier circuit which comprises transistors 7, 8, 9 and 21 as well as some of the intermediate circuitry. Its function is to develop rapidly a DC error signal whose amplitude is a function of the amplitude of the oscillations to be controlled. Secondly, there is an attenuation stage comprising transistor 35 and some of its associated circuitry. Its function is to control the amplitude of a negative feedback signal generated by the oscillator. Third, there is the oscillatory circuit whose amplitude is to be controlled. It comprises transistors 43, 59, 69, 77, 83 and 87 as well as circuits linking them. Fourth, there is positive (Wien bridge) AC feedback for sustaining the operation of the oscillator including capacitors 65 and 91 and resistors 63 and 85. Fifth, and finally, there is a negative feedback path from the oscillator to the attenuation stage 35 which includes potentiometer 53, resistor 49 and (optionally) thermistor 47. The amplitude of the negative feedback signal applied to the oscillator and hence the amplitude of the oscillator's output signal is controlled by the attenuation stage.

*Differential amplifier and rectifier subcircuit*

This subcircuit includes transistors 7 and 8 having their emitters connected together and, through resistor 6, are connected to terminal 93 which is adapted to be connected to a source of positive DC voltage such as a 12-volt battery or equivalent. Then collectors are connected to a negative DC voltage source, that of transistor 7 through resistor 10, so that when 7 conducts, a voltage will be generated across said resistor.

The base of transistor 7 is connected to terminal 5 to which a reference positive DC input voltage, say +6 volts, is applied. The sinusoidal output wave of the oscillator appearing at the output terminal 94 is applied to the base of transistor 8. Thus, transistor 7 has its base at a reference voltage, say +6 v. DC, whereas, the base of transistor 8 varies instantaneously from say +6 v. to −6 v., depending upon the point in its AC cycle. Transistor 8 will remain cut off (non-conducting) under all conditions except that when the positive peak of the sinusoidal voltage at the base becomes equal to or more positive than the reference voltage at the base of transistor 7.

When the base voltage of transistor 8 exceeds the base-voltage on transistor 7, the latter transistor turns on to produce positive-going pulses which are applied to transistor 9 which amplifies them. The output of transistor 9 consists of negative-going pulses which are applied to diode 11. The width of these pulses is related to the amount by which the crest of the output sinusoidal wave applied to transistor 8 exceeds the reference voltage on transistor 7.

It is desired to obtain a DC voltage whose amplitude is a function of the width of the rectangular pulses. Each pulse charges capacitor 13 through diode 11 and resistor 12, the time constant of capacitor 13 and resistor 12 being so arranged that the charge on the capacitor is proportional to pulse width. Capacitor 13 will almost completely discharge through resistor 15 in the interval between successive pulses in order to achieve the overall fast response necessary for stable operation. The voltage across capacitor 13 is a sawtooth wave, and this is integrated by resistor 19 and capacitor 17.

The integrated DC is then applied to transistor 21 which is in the emitter-follower configuration to give low output impedance so that large current is made available to drive the subsequent attenuator stage, namely unijunction transistor 35. Capacitor 25 and resistors 27 and 29 control the current into transistor 35 and, by giving phase advance to the error signal, stabilize the overall circuit in which the oscillator output is regulated in amplitude.

*Attenuator stage*

The unijunction transistor 35 is used in a non-conventional way. Essentially, it performs like a DC-controlled rheostat; that is, its impedance varies as a function of the input current thereto. Fixed DC bias is applied to the emitter of transistor 35 via a variable resistor 31 which is connected via output terminal 93 to a source of fixed positive DC voltage. The input current to the emitter of transistor 35 is derived from the output signal of transistor 21 which has the same polarity as its input signal. As the amplitude of the output oscillations of the subsequent oscillator increase, the emitter voltage of transistor 21 decreases and vice versa. As the latter's emitter voltage decreases some current is subtracted from the emitter of transistor 35 because the impedance of the emitter-collector circuit of transistor 21 decreases. As the current input to transistor 35 decreases, the impedance of that transistor will increase. An increase in the impedance of transistor 35 causes an increase in the voltage in the negative feedback line (now to be described) so as to compensate for the increase in the amplitude of the oscillations at the output.

*Negative feedback line*

The attenuator transistor 35 is coupled via coupling capacitor 39 and resistor 41 to the base of transistor 43. The emitters of transistors 43 and 59 are connected together and, through resistor 57, are connected to terminal 95 which is adapted to be connected to a source of negative DC voltage, say 12-volts for example. A 100 percent DC voltage negative feedback signal from the output terminal 94 is applied via potentiometer 53, and resistor 49 (and, optionally, through thermistor 47 indicated in phantom) to the base of transistor 43. Capacitor 45 is a high frequency by-pass to prevent spurious oscillation. The operation of the DC negative feedback path through resistor 49 keeps the output DC voltage at 0, thus permitting direct coupling into the oscillator output and avoiding the use of a transformer. The AC negative feedback voltage is attenuated in transistor 35. Each time there is a peak in the output wave the attenuation in transistor 35 is adjusted. Resistor 49 has a value equal to the sum of the resistances of resistor 41, the impedance of transistor 35 and the impedance of capacitor 39.

The transistors 43 and 59 feed amplified input signals to the respective bases of transistors 87 and 69. Transistors 69 and 87 form a differential amplifier, providing a single-ended output from the collector of transistor 69. Diodes 71 and 73 together with resistor 89 adjust the quiescent current through transistors 77 and 83. Capacitor 79 and resistor 81 are also designed to prevent spurious oscillation. Transistors 77 and 83 function as push-pull emitter follower stages from which the output voltage to terminal 94 is taken without the necessity for an output transformer which would be very bulky at the power levels involved.

*Positive feedback line*

To sustain oscillation there is also connected to the output terminal 94 a subcircuit which comprises capacitor 91, resistor 85, capacitor 65 and resistor 63. This circuit comprises a Wien bridge circuit in which, at some unique frequency, there is no phase reversal from the output back to the input of the oscillator at the base of transistor 59. At that frequency the Wien bridge also attenuates the output wave by 50 percent. This positive feedback circuit is isolated from the negative feedback line, giving a more stable frequency characteristic and lower harmonic content in the output oscillatory wave. The positive feedback is only 50 percent of the output signal hence, in order to sustain oscillation the amplifier (43, 59, etc.) must have a gain of 2. The gain is controlled by the values of the negativefeedback resistors 41, 49, 47 and the characteristics of the unijunction transistor 35. There is a certain amount of adjustment provided by potentiometer 53 and resistor 51.

Thermistor 47 is a temperature sensitive resistor of positive temperature coefficient; the resistance of unijunction transistor 35 varies with temperature in a predictable manner, and would thus cause some temperature drift of the oscillator output amplitude. This is compensated by introducing a compensating resistance change in resistor 47.

*General remarks*

In an embodiment of the present invention as shown in the sole figure the following values and characteristics of the components gave highly satisfactory results:

| Component No.: | | Value or identification |
|---|---|---|
| 7 | | 2N404A |
| 8 | | 2N404A |
| 9 | | 2N3638 |
| 21 | | 2N3638 |
| 35 | | 2N2646 |
| 43 | | 2N3416 |
| 59 | | 2N3416 |
| 69 | | 2N3638 |
| 77 | | 2N2270 |
| 83 | | 2N2306 |
| 87 | | 2N3638 |
| 10 | ohms | 39,000 |
| 12 | do | 100 |
| 11 | | 1N34 |
| 13 | mfd | .015 |
| 14 | ohms | 1,000 |
| 15 | do | 47,000 |
| 17 | mfd | 2 |
| 19 | ohms | 33,000 |
| 23 | do | 10,000 |
| 25 | mfd | .22 |
| 27 | ohms | 270 |
| 29 | do | 1,800 |
| 31 | do | 5,000 |
| 33 | do | 1,000 |
| 37 | | 1N707 |
| 39 | mfd | 30 |
| 41 | ohms | 7,500 |
| 45 | mmfd | 100 |
| 49 | ohms | 6,800 |
| 51 | do | 3,000 |
| 53 | do | 2,000 |
| 55 | do | 4,700 |
| 57 | do | 12,000 |
| 61 | do | 4,700 |
| 63 | do | 10,000 |
| 65 | mfd | .015 |
| 67 | ohms | 270 |
| 71 | | 1N461 |
| 73 | | 1N461 |
| 75 | ohms | 3,900 |
| 79 | mfd | .03 |
| 68 | ohms | 22 |
| 81 | do | 10 |
| 86 | do | 22 |
| 85 | do | 5,000 |
| 88 | mfd | 10 |
| 89 | ohms | 15 |
| 91 | mfd | .03 |

The values above were used in a circuit which operated at 1,000 cycles and was used to drive six volts into a 40-ohm output for a current of 0.15 of an amp. It possessed a very high stability of output amplitude on the order of 1 part in 2,000 over a wide temperature range. It also produced very good frequency stability on the order of .1 percent without requiring a crystal.

The desired amplitude of the oscillatory wave output was easily stabilized at any desired voltage by controlling the reference input voltage from terminal 5. It should be realized, however, that the reference input or control voltage at terminal 5 need not be a DC voltage. Rather, it could be a variable amplitude signal which modulates the output of the oscillator. This might be desired, for example, in cases where it is desired to convert a signal representative of displacement of a transducer or sensor, to an amplitude-modulated oscillatory wave.

I claim:

1. In combination (a) an oscillator whose amplitude is to be controlled, said oscillator having an input and an output circuit, (b) means coupled to said output circuit and adapted to be coupled to a source of a DC control signal for deriving a DC error signal whose amplitude is related to the amplitude of the output wave of said oscillator at said output circuit, said (b) means comprising means for comparing said output wave amplitude with the amplitude of said control signal, said control signal being a reference DC voltage, and means for producing a DC error signal in response to the difference in amplitude between said output wave and said reference DC voltage, said comparing means comprising:

(i) means for producing rectangular pulses whose width is a function of the difference in amplitude between said output wave and said reference DC signal, (ii) means to which said rectangular pulses are applied for producing triangular pulses whose DC level is a function of the width of said rectangular pulses, (iii) means for integrating said triangular pulses to produce said DC error signal, (c) means coupled between said output and input circuits for applying to said input circuit a negative feedback signal which includes an AC and DC component, and (d) means coupled between said (b) means and said input circuit for controlling in response to said DC error signal the amplitude of said negative feedback signal thereby to maintain said output wave under the control of said control signal, said (d) means including a solid-state variable impedance device for developing a greater negative feedback signal when said error voltage increases and vice versa, the impedance of said solid state device being a function of said DC error signal and operates to develop a negative feedback signal whose amplitude is directly proportional to said DC error signal.

2. The combination according to claim 1 wherein said oscillator includes a positive feedback circuit which comprises a Wien bridge subcircuit substantially independent of said negative feedback means.

3. The combination according to claim 1 wherein said oscillator is direct-coupled.

4. The combination according to claim 3 wherein said oscillator includes means for producing a push-pull output signal.

5. The combination according to claim 1 wherein said solid-state device is a unijunction transistor.

References Cited

UNITED STATES PATENTS

| | | | |
|---|---|---|---|
| 3,144,619 | 8/1964 | Cochran | 331—109 |
| 3,164,783 | 1/1965 | Houpt | 331—109 |
| 3,179,900 | 4/1965 | Garland et al. | 331—109 |
| 3,254,308 | 5/1966 | McLean et al. | 330—29 X |
| 3,339,156 | 8/1967 | Niedereder | 331—183 X |

OTHER REFERENCES

"Digital Oscillator Provides Settable Frequencies, Voltages," Electronic Design, July 20, 1964.

ROY LAKE, *Primary Examiner.*

JAMES B. MULLINS, *Assistant Examiner.*

U.S. Cl. X.R.

331—141, 183